(12) United States Patent
Cheng et al.

(10) Patent No.: US 9,773,812 B2
(45) Date of Patent: Sep. 26, 2017

(54) INTEGRATED CIRCUIT WITH HETEROGENEOUS CMOS INTEGRATION OF STRAINED SILICON GERMANIUM AND GROUP III-V SEMICONDUCTOR MATERIALS AND METHOD TO FABRICATE SAME

(71) Applicant: International Business Machines Corporation, Armonk, NY (US)

(72) Inventors: Cheng-Wei Cheng, White Plains, NY (US); Pouya Hashemi, White Plains, NY (US); Effendi Leobandung, Stormville, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/402,359

(22) Filed: Jan. 10, 2017

(65) Prior Publication Data
US 2017/0125445 A1 May 4, 2017

Related U.S. Application Data

(62) Division of application No. 14/879,512, filed on Oct. 9, 2015.

(51) Int. Cl.
*H01L 27/12* (2006.01)
*H01L 27/092* (2006.01)
(Continued)

(52) U.S. Cl.
CPC ...... *H01L 27/1211* (2013.01); *H01L 27/0924* (2013.01); *H01L 29/045* (2013.01); *H01L 29/161* (2013.01); *H01L 29/20* (2013.01)

(58) Field of Classification Search
CPC ......... H01L 27/1211; H01L 21/823821; H01L 21/845; H01L 29/165; H01L 29/7851;
(Continued)

(56) References Cited

U.S. PATENT DOCUMENTS

7,494,884 B2   2/2009   Lin et al.
7,618,866 B2   11/2009  Luo et al.
(Continued)

*Primary Examiner* — Daniel Luke
*Assistant Examiner* — Khatib Rahman
(74) *Attorney, Agent, or Firm* — Harrington & Smith; Louis J. Percello (57) ABSTRACT

A structure includes an off-axis Si substrate with an overlying s-$Si_{1-x}Ge_x$ layer and a BOX between the off-axis Si substrate and the s-$Si_{1-x}Ge_x$ layer. The structure further includes pFET fins formed in the s-$Si_{1-x}Ge_x$ layer and a trench formed through the s-$Si_{1-x}Ge_x$ layer, the BOX and partially into the off-axis Si substrate. The trench contains a buffer layer in contact with the off-axis Si substrate, a first Group III-V layer disposed on the buffer layer, a semi-insulating Group III-V layer disposed on the first Group III-V layer and a second Group III-V layer disposed on the semi-insulating Group III-V layer, as well as nFET fins formed in the second Group III-V layer. The s-$Si_{1-x}Ge_x$ layer has a value of x that results from a condensation process that merges an initial s-$Si_{1-x}Ge_x$ layer with an initial underlying on-axis <100> Si layer. A method to fabricate the structure is also disclosed.

8 Claims, 5 Drawing Sheets

(51) Int. Cl.
*H01L 29/161* (2006.01)
*H01L 29/20* (2006.01)
*H01L 29/04* (2006.01)

(58) Field of Classification Search
CPC ........... H01L 29/66795; H01L 29/7848; H01L 29/785; H01L 21/02532
See application file for complete search history.

(56) References Cited

U.S. PATENT DOCUMENTS

| | | | |
|---|---|---|---|
| 7,960,798 B2 | 6/2011 | Luo et al. | |
| 8,614,433 B2 | 12/2013 | Lee et al. | |
| 8,901,009 B2 | 12/2014 | Lee et al. | |
| 2006/0134893 A1* | 6/2006 | Savage | H01L 21/6835 438/483 |
| 2008/0050918 A1* | 2/2008 | Damlencourt | B82Y 10/00 438/694 |
| 2008/0135949 A1* | 6/2008 | Lo | B82Y 10/00 257/401 |
| 2009/0081854 A1* | 3/2009 | Kim | B82Y 10/00 438/478 |
| 2012/0261792 A1* | 10/2012 | Cheng | H01L 21/84 257/510 |

\* cited by examiner

INTEGRATED CIRCUIT WITH HETEROGENEOUS CMOS INTEGRATION OF STRAINED SILICON GERMANIUM AND GROUP III-V SEMICONDUCTOR MATERIALS AND METHOD TO FABRICATE SAME

CROSS REFERENCE TO RELATED APPLICATION

This patent application is a divisional application of copending U.S. patent application Ser. No. 14/879,512, filed on Oct. 9, 2015, the disclosure of which is incorporated by reference herein in its entirety.

TECHNICAL FIELD

The various embodiments of this invention relate generally to semiconductor devices and fabrication techniques and, more specifically, relate to the fabrication of integrated circuits containing strained SiGe (s-SiGe) and Group III-V semiconductor materials.

BACKGROUND

Strained $Si_{1-x}Ge_x$ with a Ge content in a range of, for example, approximately 0.4-0.6 is a viable candidate for small geometry devices (e.g., 7 nm) and beyond. The s-SiGe can be especially advantageous for fabricating p-type field effect transistors (pFETs). While the use of strained Si (s-Si) can be beneficial when fabricating n-type FETs (nFETs), the use of Group III-V materials to fabricate nFETs is also attractive due at least to the enhanced carrier mobility that can be achieved.

One approach to achieving sub-10 nm geometry devices would be to co-integrate SiGe with a Group III-V compound semiconductor material. The Group III-V material could be a binary material such, as for example, Gallium Arsenide (GaAs) or Gallium Antimonide (GaSb). The Group III-V material could also be a tertiary material such as, for example, Indium Gallium Arsenide (InGaAs) or Indium Gallium Antimonide (InGaSb).

An ability to co-integrate s-SiGe and Group III-V semiconductor materials, and corresponding pFETs and nFETs, on a common substrate is thus a desirable goal.

SUMMARY

In a first aspect thereof the embodiments of this invention provide a method that comprises providing a starting substrate that comprises an off-axis Si substrate, an overlying dielectric layer and an on-axis Si layer disposed on the dielectric layer. The method further comprises epitaxially growing a $s-Si_{1-x}Ge_x$ layer on a surface of the on-axis Silicon layer; merging the $s-Si_{1-x}Ge_x$ layer and the on-axis Si layer to form a merged $s-Si_{1-x}Ge_x$ layer and an oxide layer disposed on the merged $s-Si_{1-x}Ge_x$ layer; forming a trench through the oxide layer, the merged $s-Si_{1-x}Ge_x$ layer, the dielectric layer and partially into the off-axis Si substrate; epitaxially growing in the trench a buffer layer in contact with the off-axis Si substrate, a first Group III-V layer on the buffer layer, a semi-insulating Group III-V layer on the first Group III-V layer and a second Group III-V layer on the semi-insulating Group III-V layer; and patterning and etching the merged $s-Si_{1-x}Ge_x$ layer and the second Group III-V layer to form a plurality of pFET fins in the merged $s-Si_{1-x}Ge_x$ layer and a plurality of nFET fins in the second Group III-V layer.

In another aspect thereof the embodiments of this invention provide a structure that comprises an off-axis Si substrate having an overlying $s-Si_{1-x}Ge_x$ layer and a buried oxide layer disposed between the off-axis Si substrate and the $s-Si_{1-x}Ge_x$ layer. The structure further comprises a plurality of pFET fins formed in the $s-Si_{1-x}Ge_x$ layer and a trench formed through the $s-Si_{1-x}Ge_x$ layer, the buried oxide layer and partially into the off-axis Si substrate. The trench contains a buffer layer in contact with the off-axis Si substrate, a first Group III-V layer disposed on the buffer layer, a semi-insulating Group III-V layer disposed on the first Group III-V layer and a second Group III-V layer disposed on the semi-insulating Group III-V layer. The structure further comprises a plurality of nFET fins formed in the second Group III-V layer.

BRIEF DESCRIPTION OF THE SEVERAL VIEWS OF THE DRAWINGS

FIGS. 1-9 are each an enlarged cross-sectional view showing various initial, intermediate and completed or substantially completed structures that are fabricated in accordance with embodiments of this invention, wherein the various layer thicknesses and other dimensions are not necessarily drawn to scale. More specifically:

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses and methods that are suitable for use in implementing the embodiments of this invention can include, but are not limited to, chemical vapor deposition (CVD) such as, for example, rapid thermal chemical vapor deposition (RTCVD), atmospheric pressure chemical vapor deposition (APCVD), low pressure chemical vapor deposition (LP-CVD) and ultra-high vacuum chemical vapor deposition (UHVCVD). Other suitable epitaxial growth processes can include, but are not limited to, molecular beam epitaxy (MBE) and low-energy plasma deposition (LEPD). The temperature for an epitaxial deposition process typically ranges from about 300° C. to about 900° C. Although higher temperature will typically result in faster deposition of the semiconductor material, the faster deposition may also result in crystal defects and film cracking.

In at least one embodiment thereof this invention can employ semiconductor on insulator (SOI) technology where a thin semiconductor layer, such as a layer of Si or s-SiGe, is formed over an insulating layer, such as silicon oxide, which in turn is formed over a (bulk) substrate, such as a Si substrate. The insulating layer can be referred to as a buried oxide (BOX) layer or simply as a BOX. For a single BOX SOI wafer the SOI layer can be divided into active regions by shallow trench isolation (STI) which intersects the BOX and provides total isolation for active device regions formed in the SOI layer. For FinFET devices fin structures can be defined in the SOI layer and sources and drains can be formed, for example, by ion implantation of N-type or P-type dopants into the fins. A FET channel region between a source/drain pair can be created so as to underlie a gate structure.

The embodiments of this invention provide at least in part a method and a structure to co-integrate Group III-V fins (and/or planar devices) and s-SiGe fins (and/or planar devices) using a strained Germanium on insulator (SGOI) on-axis <100> layer and Group III-V material on a semi-insulating layer grown on an off-axis <100> layer. The off-axis <100> layer can be a handle substrate for the SGOI on-axis <100> layer. The use of the off-axis Si substrate beneficially reduces defects in the epitaxially grown Group III-V material and thus reduces an occurrence of defects in the channel portion of Group III-V transistors. Further, the use of the embodiments of this invention enables the provision of planar FETs and FinFETs with biaxial s-SiGe and uniaxial s-SiGe for pFETs and relaxed or strained Group III-V material for nFETs. The use of the method yields an ability to have a variety of Ge ranges for the SGOI thereby providing a designer 'knobs' for voltage threshold ($V_{th}$) tuning as well as overall performance.

Figure 1:
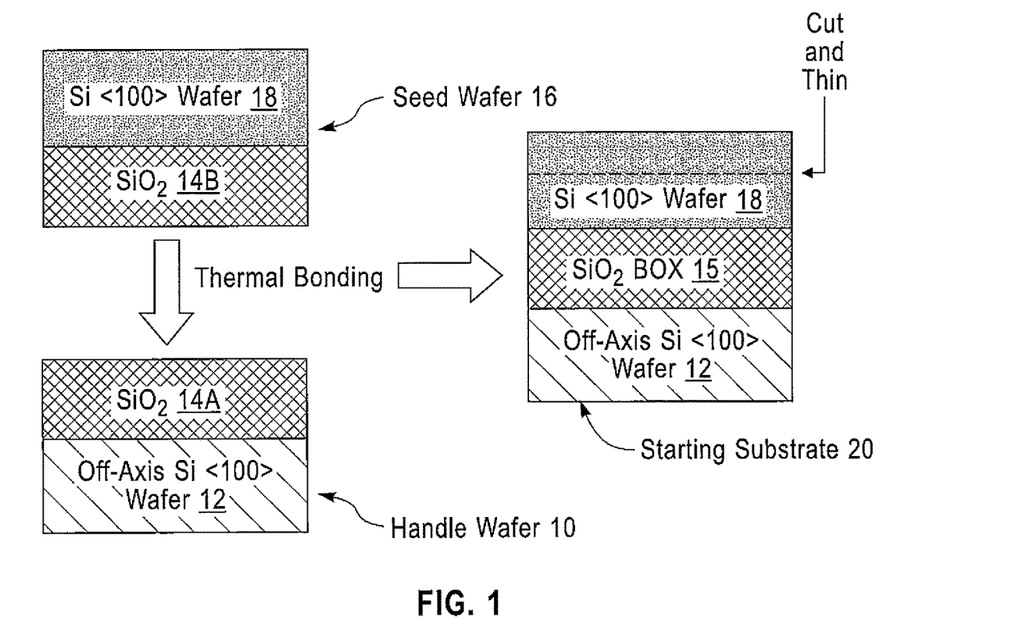
FIG. 1 shows an exemplary wafer bonding approach to form a starting substrate that is illustrated in FIG. 2.
Figure 2:
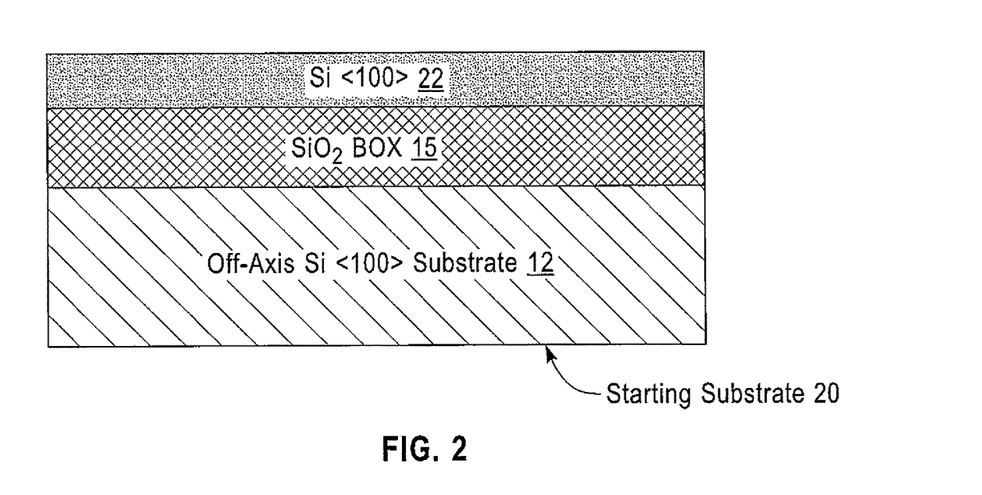
FIG. 2 shows the starting substrate that includes an off-axis <100> Silicon substrate, an overlying dielectric layer (BOX) and an overlying on-axis <100> Silicon layer.

FIG. 1 shows in enlarged cross-sectional views (not to scale) an overview of one possible procedure to form a starting substrate 20 that is illustrated in FIG. 2. In FIG. 1 a handle wafer 10 is composed, in this example, of an off-axis <100> Silicon substrate 12 having an overlying dielectric (oxide) layer (e.g., $SiO_2$) 14A. Also provided is what may be referred to for convenience as a seed wafer 16 having, in this non-limiting example, an on-axis <100> Silicon substrate 18 and an overlying dielectric (oxide) layer (e.g., $SiO_2$) 14B. The seed wafer 16 is inverted and the oxide layer 14B is wafer bonded using any conventional procedure (typically involving the application of heat and pressure) to the oxide layer 14A of the handle wafer 10. The bonded oxide layers 14A and 14B can, after wafer bonding, be considered to form a buried oxide layer (BOX) 15. The on-axis <100> Silicon substrate 18 is then thinned to a desired thickness by any suitable process, such as one known as Smart Cut® and/or or by grinding and chemical mechanical polishing (CMP) to form the Silicon layer 22 shown in FIG. 2.

FIG. 2 shows the resulting starting substrate 20 wherein the off-axis <100> Silicon substrate 12 can have any desired thickness, the BOX 15 can have a thickness in an exemplary range of about 50 nm to about 250 nm, with about 150 nm being one suitable nominal value, and the on-axis <100> Silicon layer 22 can have a thickness in a range of, by example, about 6 nm to about 20 nm.

The off-axis <100> Silicon substrate 12 can be provided with, for example, about a 2° to about a 6° off cut obtained by rotation about the <011> axis. The resulting off-axis wafer surface will exhibit, if viewed with high magnification, a stepped appearance. The use of the off-axis Si substrate 12 facilitates the growth of higher quality Group III-V films than can be achieved on an on-axis Si surface.

Figure 3:
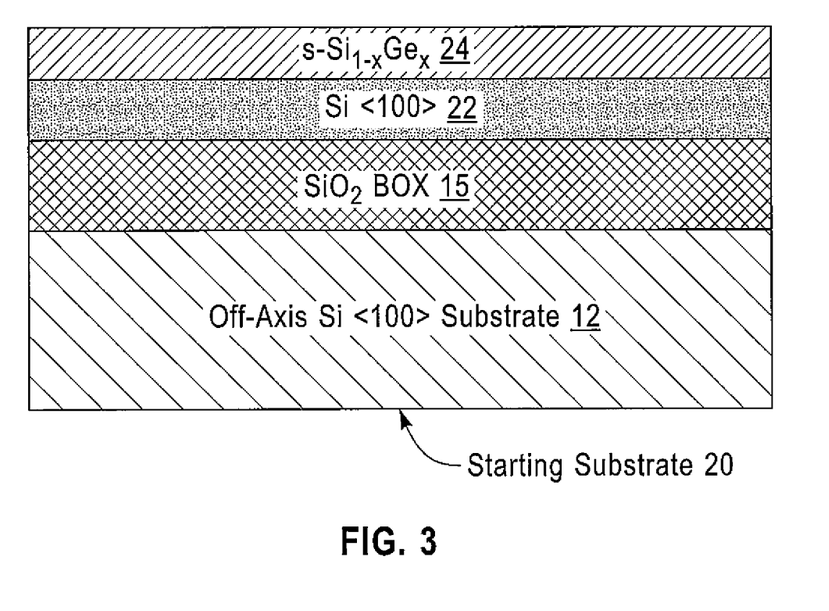
FIG. 3 shows the structure of FIG. 2 after the epitaxial growth of a strained $Si_{1-x}Ge_x$ layer on the surface of the on-axis <100> Silicon layer.

FIG. 3 shows the structure of FIG. 2 after the epitaxial growth of a strained $Si_{1-x}Ge_x$ layer 24 on the surface of the on-axis <100> Silicon layer 22. In the strained $Si_{1-x}Ge_x$ layer 24 the value of x can be in a range of, as a non-limiting example, about 0.15 to about 0.3. The s-$Si_{1-x}Ge_x$ layer 24 could have a thickness, in one non-limiting embodiment, of about 40 nm to about 80 nm. If the value of x in the s-$Si_{1-x}Ge_x$ layer 24 is instead about 0.5 then the strained $Si_{1-x}Ge_x$ layer 24 can have a thickness in a range of about 20 nm to about 60 nm. In general, the thickness is a function of the value of x in order to produce a strained $Si_{1-x}Ge_x$ layer on the Si <100> layer 18.

Figure 4:
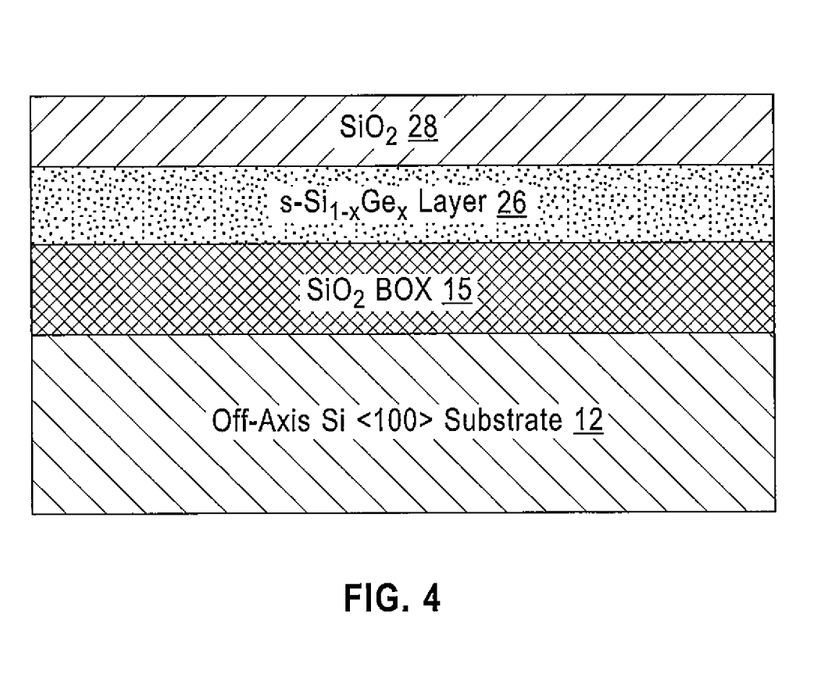
FIG. 4 shows the structure of FIG. 3 after performing a condensation process to effectively merge the strained $Si_{1-x}Ge_x$ layer and the underlying on-axis <100> Silicon layer to form a $s-Si_{1-x}Ge_x$ layer disposed on the BOX layer and a layer of oxide ($SiO_2$) on the $s-Si_{1-x}Ge_x$ layer.

FIG. 4 shows the structure of FIG. 3 after performing a thermal condensation process using one step or multi-step oxidation and oxide removal. The thermal condensation process consumes a portion of Si to form $SiO_2$ and increases the Ge concentration, and effectively merges the strained $Si_{1-x}Ge_x$ layer 24 and the underlying on-axis <100> Silicon layer 22 to form a s-$Si_{1-x}Ge_x$ layer 26 (e.g., 0.2≤x≤1) that is disposed on the BOX 15. The s-$Si_{1-x}Ge_x$ layer 26 could be referred to as a merged s-$Si_{1-x}Ge_x$ layer and, due to the Ge condensation process and the relative thinness of the on-axis <100> Silicon layer 22, will have a value of x greater than the value of x that was present in the s-$Si_{1-x}Ge_x$ layer 24.

The performance of the condensation process also forms an overlying layer 28 of $SiO_2$. One suitable but not limiting range of temperature is about 700° C. to about 1000° C. for a period of some minutes. In a case where the condensation process involves oxidation, the oxygen reacts with silicon in the $Si_{1-x}Ge_x$ to form the thermal silicon oxide layer 28. Depending on the Ge concentration the thickness of the s-$Si_{1-x}Ge_x$ layer 26 can be, for example, about 50 nm for x having a value of about 0.2, about 25 nm-30 nm for x having a value of about 0.5, or about 5 nm-10 nm for x having a value of about 0.8.

Figure 5:
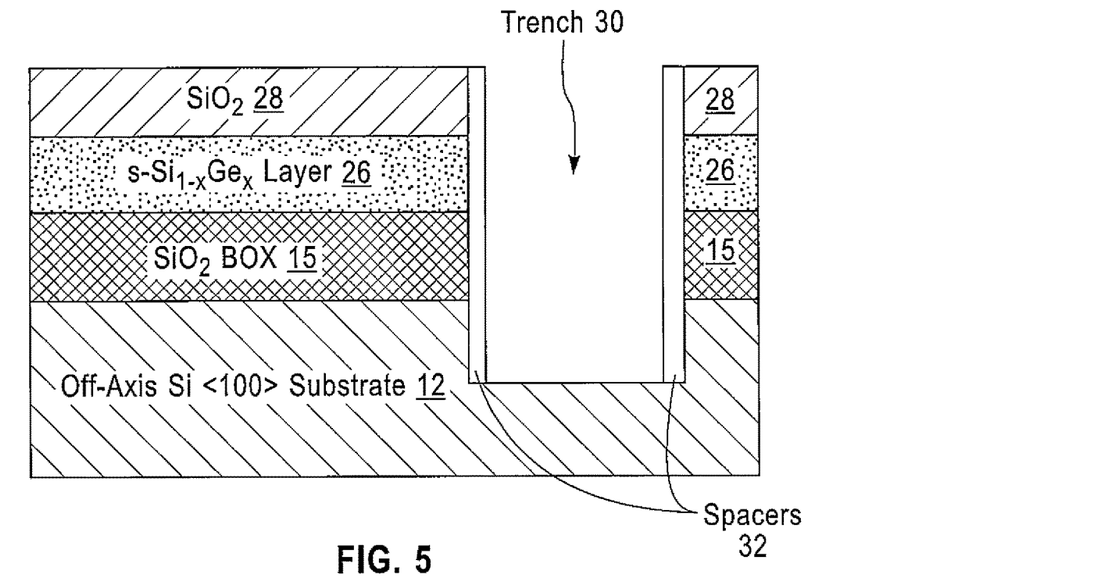
FIG. 5 shows the structure of FIG. 4 after performing an etch to form a trench through the oxide layer, the $s-Si_{1-x}Ge_x$ layer, the BOX and partially into the off-axis <100> Si substrate.

FIG. 5 shows the structure of FIG. 4 after performing a single step or a multi-step etch to form a trench 30 through the layer 28 of $SiO_2$, the s-$Si_{1-x}Ge_x$ layer 26, the BOX 15 and partially into the off-axis <100> Si substrate 12. The width and length of the opening of the trench 30 is a function of a desired active area that will be formed in the trench, with about 500 nm to about 3000 nm being one suitable width range. The depth of the trench 30 within the off-axis <100> Si substrate 12 can be, for example, in a range of about 500 nm to about 1000 nm. A dielectric spacer 32, e.g., $SiO_2$, is formed on the sidewalls of the trench 30. This can be accomplished by a blanket deposition of $SiO_2$ followed by a reactive ion etch (RIE) procedure to remove the $SiO_2$ from horizontal surfaces.

Figure 6:
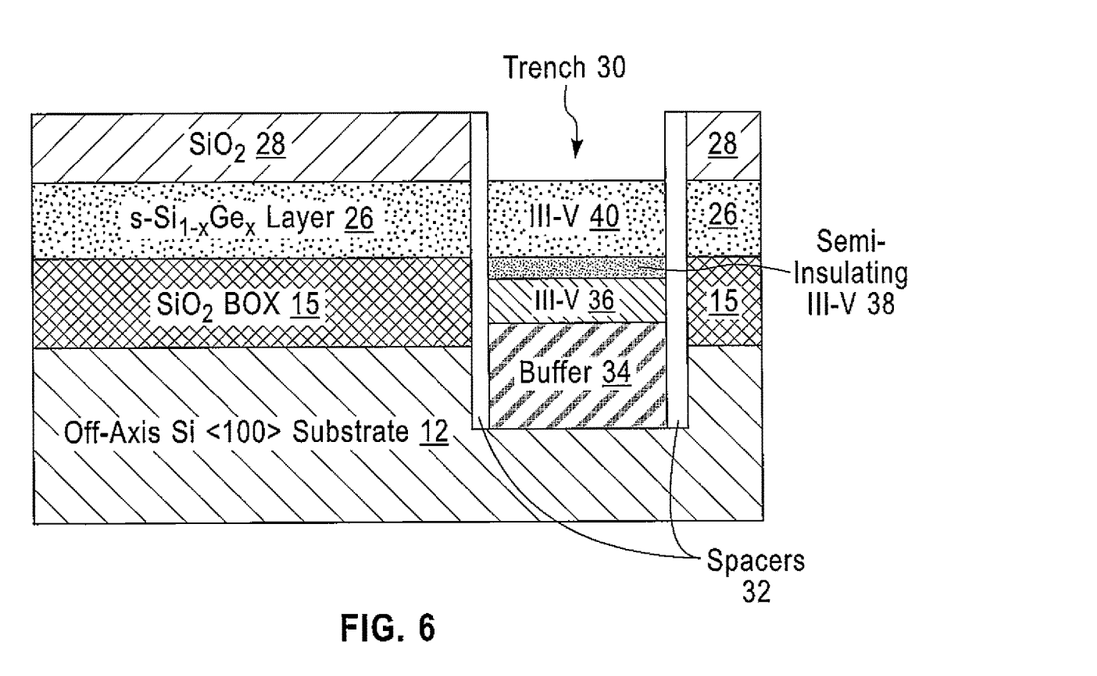
FIG. 6 shows the structure of FIG. 5 after the epitaxial growth in the trench of a buffer layer, a Group III-V layer, a semi-insulating Group III-V layer and another Group III-V layer that will form a Group III-V transistor (nFET) channel.

FIG. 6 shows the structure of FIG. 5 after the epitaxial growth in the trench 30 of a buffer layer 34, such as a layer of Ge or GaAs, a Group III-V layer 36, a semi-insulating Group III-V layer 38 and what will be a Group III-V channel of a completed transistor device, such as a layer 40 of InGaAs or InGaSb or GaInP, as three non-limiting examples. In a non-limiting embodiment the buffer layer 34 could have a thickness in a range 500 nm to about 1500 nm, the Group III-V layer 36 could be comprised of InP having a minimum thickness of about 500 nm and the semi-insulating Group III-V layer 38 could be a layer of iron-doped (Fe-doped) InP having a thickness in a range of about 30 nm to about 100 nm, with about 50 nm being one acceptable nominal thickness. The channel layer 40 has a thickness corresponding to, for example, a desired fin height (e.g., about 20 nm to about 100 nm, with about 30 nm to about 50 nm being a preferred range of fin height). In general, it can be desirable to make the thickness of the channel layer 40 comparable to the thickness of the s-$Si_{1-x}Ge_x$ layer 26 so as to produce pFET fins and nFET fins having similar if not equal heights. This can be achieved at least in part by adjusting during epitaxial growth the thickness of one or more of the underlying buffer layer 34, III-V layer 36 and semi-insulating Group III-V layer 38 in view of the depth of the trench 30 into the off-axis <100> Si substrate 12. Metal-Organic Vapor Phase Epitaxy (MOVPE) and MBE are non-limiting examples of suitable epitaxial growth techniques for growing the layers 34-40.

In general, the Group III-V layer 36 can be considered to form a part of the buffer layer 34 by adjusting the lattice constant from Ge to the lattice constant of InP. As was noted the semi-insulating layer 38 could be iron doped InP ($5\times10^{18}$ Fe), or it could be, for example, InAlAs with 48% Indium, both having the same lattice constant as InP. The device III-V layer 40 could be InGaAs with 53% Indium, also having the same lattice constant as InP.

Figure 7:
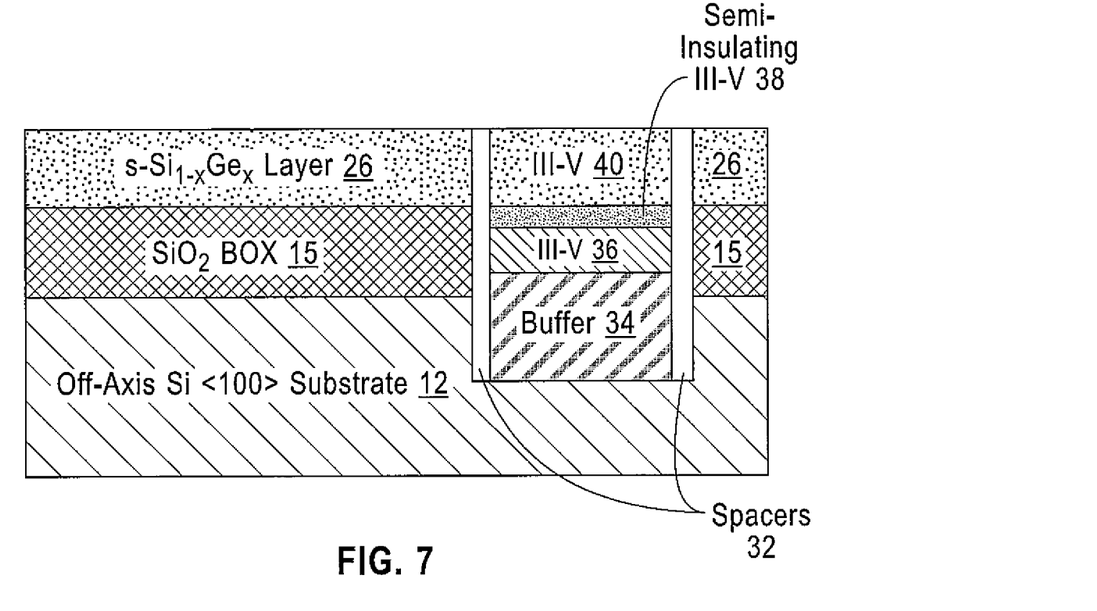
FIG. 7 shows the structure of FIG. 6 after removal of the $SiO_2$ layer.

FIG. 7 shows the structure of FIG. 6 after removal of the $SiO_2$ layer 28. An etching process and a CMP process can be performed to remove the $SiO_2$ layer 28 (and an upper portion of the Group III-V channel layer 40 if needed).

Figure 8:
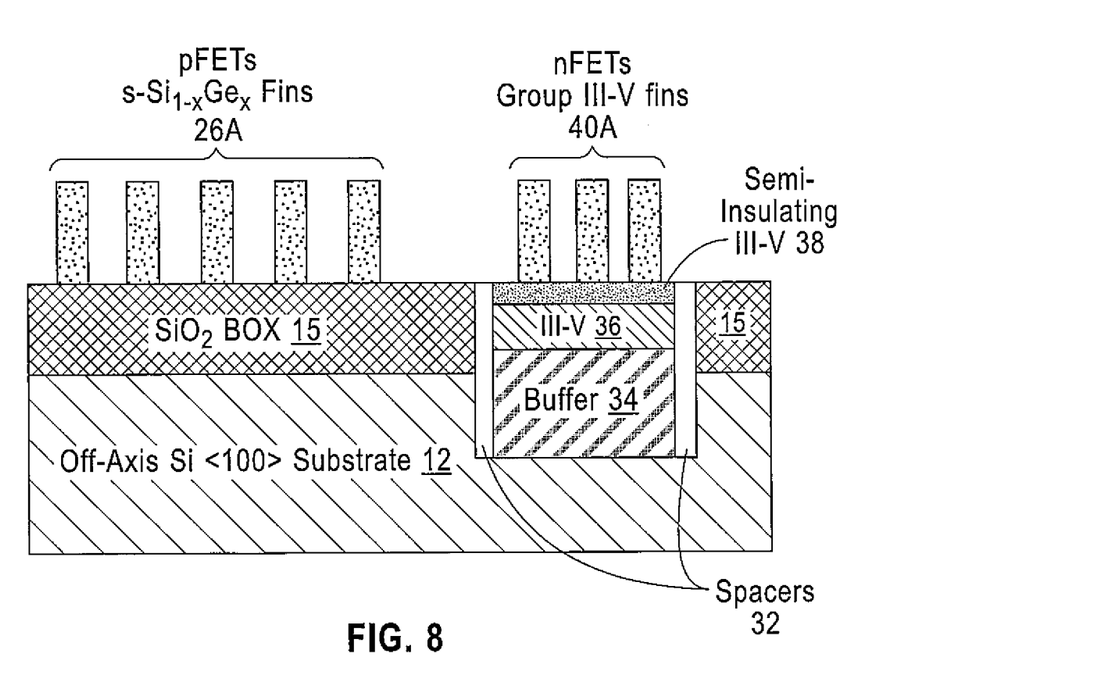
FIG. 8 shows the structure of FIG. 7 after photolithographic patterning and etching to form a plurality of pFET fins in the $s-Si_{1-x}Ge_x$ layer and a plurality of nFET fins in the Group III-V channel layer.

FIG. 8 shows the structure of FIG. 7 after photolithographic patterning and performing RIE processes to form a plurality of pFET fins 26A in the s-$Si_{1-x}Ge_x$ layer 26 and a plurality of nFET fins 40A in the Group III-V channel layer 40. The pFET fins 26A are disposed on the surface of the BOX 15 while the nFET fins 40A are disposed on the surface of the semi-insulating Group III-V layer 38. The fin widths can be in a range of, by example, about 6 nm to about 12 nm, with about 7 nm-8 nm being one desirable width. The fin heights are approximately equal to the thicknesses of the s-$Si_{1-x}Ge_x$ layer 26 and the Group III-V channel layer 40 as was discussed above. In some preferred embodiments the top surfaces of the pFET fins 26A are substantially co-planar with the top surfaces of the nFET fins 40A. The fin lengths (into the page of drawing) can have any desired values depending on the end use. Processing of the fins 26A and 40A can then continue in a conventional manner to form source/drains (S/Ds), gate structures/stacks, dielectric layer deposition(s) and vertical and horizontal metallization as needed for interconnecting the n-type and p-type FinFETs into the desired circuit topology.

Figure 9:
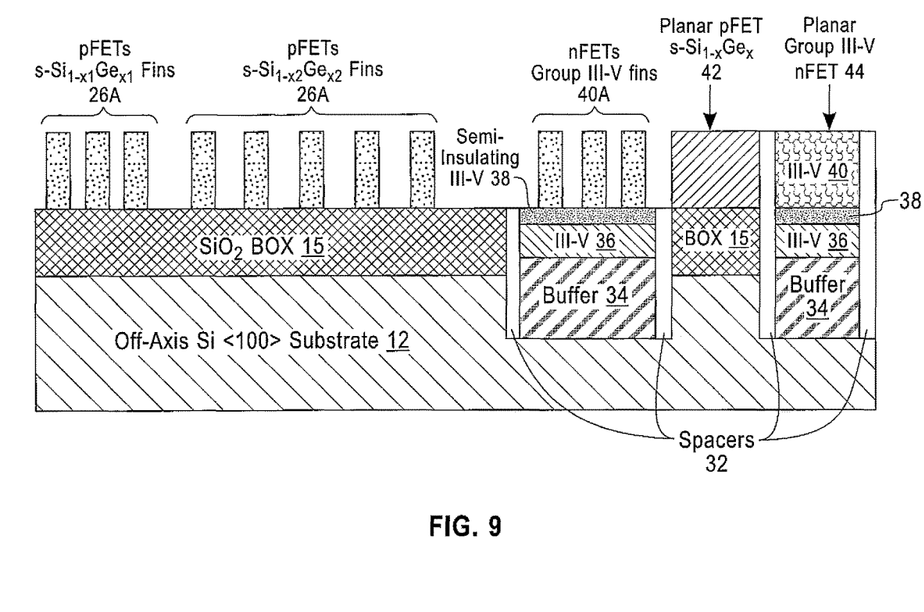
FIG. 9 illustrates one exemplary arrangement wherein the teachings of this invention are used to provide the plurality of pFET fins in the $s-Si_{1-x}Ge_x$ layer and the plurality of nFET fins in the Group III-V channel layer, as in FIG. 8, and to also provide at least one of planar pFET and planar nFET transistors on the same common substrate.

FIG. 9 illustrates one exemplary arrangement wherein the teachings of this invention are used to provide the plurality of pFET fins 26A in the s-$Si_{1-x}Ge_x$ layer 26 and the plurality of nFET fins 40A in the Group III-V channel layer 40, as in FIG. 8, and to also provide planar pFETs 42 and planar nFETs 44 on the same common substrate. It can be seen that in this embodiment that portions of the s-$Si_{1-x}Ge_x$ layer 26 and the Group III-V channel layer 40 are not processed to form fins. Instead, the channel portions are left undifferentiated and source/drains can be implanted or grown and appropriate gate stacks and contact metallization applied.

It can also be seen in FIG. 9 that different Ge fractions can be used for the pFETs 26A thereby providing an ability to adjust or tune the threshold voltages ($V_{th}$) across the wafer for different devices. In this example a first set of pFET fins are formed in a first s-$Si_{1-x1}Ge_{x1}$ layer and a second set of pFET fins are formed in a second s-$Si_{1-x2}Ge_{x2}$ layer where x1 is less than or greater than x2. These different regions can be accommodated, for example, during the growth of the s-$Si_{1-x}Ge_x$ layer 24 in FIG. 3 by selective masking and epitaxially growing different s-$Si_{1-x}Ge_x$ regions with different initial values of x. Further, it is also within the scope of the teachings of this invention to epitaxially grow different Group III-V semiconductor materials, or the same Group III-V semiconductor materials but having different relative constituent concentrations, in different ones of the channel layers 40 in different trenches so as to provide nFETs having different operational characteristics (e.g., different charge carrier mobility).

Based on the foregoing description it should be appreciated that the exemplary embodiments of this invention provide methods and structures that co-integrate the Group III-V fins 40A (and/or planar devices 44) and s-SiGe fins 26A (and/or planar devices 42) using the SGOI on-axis <100> layer 24, and the Group III-V material on the semi-insulating Group III-V layer 38, that are grown on the off-axis <100> layer 12. The off-axis <100> Si layer 12 can be a handle substrate for the SGOI on-axis <100> layer 24 as was depicted in FIG. 1. The use of the off-axis <100> Si layer 12 can reduce an occurrence of defects in the epitaxially grown Group III-V material. Furthermore, and as can be seen in FIG. 9, the use of the embodiments of this invention enables the provision of planar FETs and FinFETs with biaxial s-SiGe and uniaxial s-SiGe for pFETs and relaxed or strained Group III-V material for nFETs. The use of the embodiments of this invention also provides an ability to have different ranges of Ge concentration to enable $V_{th}$ and other parameters to be varied between devices.

It is to be understood that although the exemplary embodiments discussed above with reference to FIGS. 1-9 can be used on common variants of the FET device including, e.g., FET devices with multi-fingered FIN and/or gate structures and FET devices of varying gate width and length. Moreover, transistor devices can be connected to metalized pads or other devices by conventional ultra-large-scale integration (ULSI) metalization and lithographic techniques.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching processes may be used by those skilled in the art. Further, the exemplary embodiments are not intended to be limited to only those semiconductor materials, dielectrics, Ge concentrations, layer thicknesses and the like that were specifically disclosed above. Any and all such and similar modifications of the teachings of this invention will still fall within the scope of this invention.

What is claimed is:

1. A structure comprising:
    an off-axis Si substrate having an overlying s-$Si_{1-x}Ge_x$ layer and a buried oxide layer disposed between the off-axis Si substrate and the s-$Si_{1-x}Ge_x$ layer;
    a first plurality of pFET fins formed in the s-$Si_{1-x}Ge_x$ layer;
    a trench formed through the s-$Si_{1-x}Ge_x$ layer, the buried oxide layer and partially into the off-axis Si substrate, the trench containing a buffer layer in contact with the off-axis Si substrate, a first Group III-V layer disposed on the buffer layer, a semi-insulating Group III-V layer disposed on the first Group III-V layer and a second Group III-V layer disposed on the semi-insulating Group III-V layer; and
    a first plurality of nFET fins formed in the second Group III-V layer.

2. The structure as in claim 1, further comprising a dielectric spacer disposed on vertical sidewalls of the trench.

3. The structure as in claim 1, where the s-$Si_{1-x}Ge_x$ layer has a value of x that results from a condensation process that merges an initial s-$Si_{1-x}Ge_x$ layer having an initial value of x with an underlying initial on-axis <100> Si layer, where the initial value of x is less than the value of x in the s-$Si_{1-x}Ge_x$ layer.

4. The structure as in claim 1, further comprising a second plurality of pFET fins formed in the s-$Si_{1-x}Ge_x$ layer, where the value of x in the first plurality of pFET fins is different than a value of x in the second plurality of pFET fins.

5. The structure as in claim 1, further comprising a second trench formed through the s-$Si_{1-x}Ge_x$ layer, the buried oxide layer and partially into the off-axis Si substrate, the second trench containing a buffer layer in contact with the off-axis Si substrate, a first Group III-V layer disposed on the buffer layer, a semi-insulating Group III-V layer disposed on the first Group III-V layer and a second Group III-V layer disposed on the semi-insulating Group III-V layer; and
    a second plurality of nFET fins formed in the second Group III-V layer of the second trench.

6. The structure as in claim 5, where the second Group III-V layer disposed in the second trench is compositionally different than the second Group III-V layer disposed in the first trench.

7. The structure as in claim 1, where the semi-insulating Group III-V layer is comprised of Fe-doped InP.

8. The structure as in claim 1, where the off-axis Si substrate is a <100> Si substrate provided with about a 2° to about a 6° off cut obtained by rotation about a <011> axis.

* * * * *